(12) United States Patent
Zhang et al.

(10) Patent No.: US 9,299,602 B2
(45) Date of Patent: Mar. 29, 2016

(54) ENABLING PACKAGE-ON-PACKAGE (POP) PAD SURFACE FINISHES ON BUMPLESS BUILD-UP LAYER (BBUL) PACKAGE

(75) Inventors: Qinglei Zhang, Chandler, AZ (US); Tao Wu, Chandler, AZ (US); Mark S. Hlad, Chandler, AZ (US); Charavana K. Gurumurthy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,146

(22) PCT Filed: Dec. 20, 2011

(86) PCT No.: PCT/US2011/066320
§ 371 (c)(1),
(2), (4) Date: Jun. 21, 2013

(87) PCT Pub. No.: WO2013/095405
PCT Pub. Date: Jun. 27, 2013

(65) Prior Publication Data
US 2013/0320547 A1   Dec. 5, 2013

(51) Int. Cl.
*H01L 21/768* (2006.01)
*H01L 23/498* (2006.01)
*H01L 25/10* (2006.01)
(Continued)

(52) U.S. Cl.
CPC .......... *H01L 21/768* (2013.01); *H01L 21/4857* (2013.01); *H01L 23/498* (2013.01); *H01L 23/49822* (2013.01); *H01L 23/5389* (2013.01); *H01L 25/105* (2013.01); *H01L 24/16* (2013.01); *H01L 2224/131* (2013.01); *H01L 2224/16225* (2013.01); *H01L 2225/1035* (2013.01); *H01L 2225/1058* (2013.01); *H01L 2924/12042* (2013.01); *H01L 2924/15311* (2013.01); *H01L 2924/15321* (2013.01); *H01L 2924/18162* (2013.01); *H05K 3/3436* (2013.01); *H05K 2201/10515* (2013.01)

(58) Field of Classification Search
CPC ..... H01L 21/768; H01L 23/498; H01L 23/48; H01L 21/302; H01L 23/488; H01L 21/60; H01L 21/50; H01L 23/34; H01L 23/552; H01L 23/485; H05K 1/09
USPC .................. 257/766, 659, E21.505, E21.499, 257/E23.114; 438/612, 125
See application file for complete search history.

(56) References Cited

U.S. PATENT DOCUMENTS

2005/0112399 A1 * 5/2005 Gray et al. .................... 428/678
2011/0108999 A1   5/2011 Nalla et al.
(Continued)

OTHER PUBLICATIONS

International Search Report mailed Sep. 24, 2012 for PCT/US2011/066320, filed Dec. 20, 2011, 3 pages.
(Continued)

*Primary Examiner* — Selim Ahmed
(74) *Attorney, Agent, or Firm* — Blakely, Sokoloff, Taylor & Zafman LLP

(57) ABSTRACT

A bumpless build-up layer (BBUL) integrated circuit package and method of manufacturing are presented. In some embodiments, the package-on-package (PoP) pads of the BBUL integrated circuit package has a surface finish that can be palladium, nickel-palladium, nickel-gold, nickel-palladium-gold, or palladium-nickel-palladium-gold. In some embodiments, the PoP pad surface finish can be formed using either an electroless or electrolytic process.

25 Claims, 12 Drawing Sheets

(51) Int. Cl.
*H01L 23/538* (2006.01)
*H01L 21/48* (2006.01)
H01L 23/00 (2006.01)
H05K 3/34 (2006.01)

(56) References Cited

U.S. PATENT DOCUMENTS

2011/0147933 A1* 6/2011 Wu et al. .................. 257/741
2011/0227214 A1 9/2011 Tateiwa et al.
2011/0241186 A1* 10/2011 Nalla et al. .................. 257/659
2011/0241195 A1 10/2011 Nalla et al.

OTHER PUBLICATIONS

First Office Action from the Taiwan Intellectual Property Office dated Jan. 21, 2015, Taiwan Patent Application No. 101145664 and Search Report (English Translation).

Notice of Allowance from the Taiwan Intellectual Property Office dated Oct. 26, 2015, Taiwan Patent Application No. 101145664 and English Translation thereof.

* cited by examiner

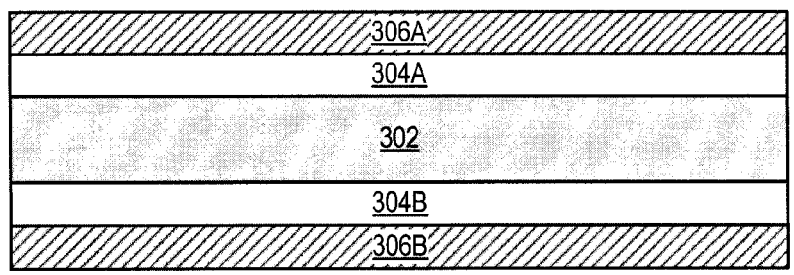
FIG. 3
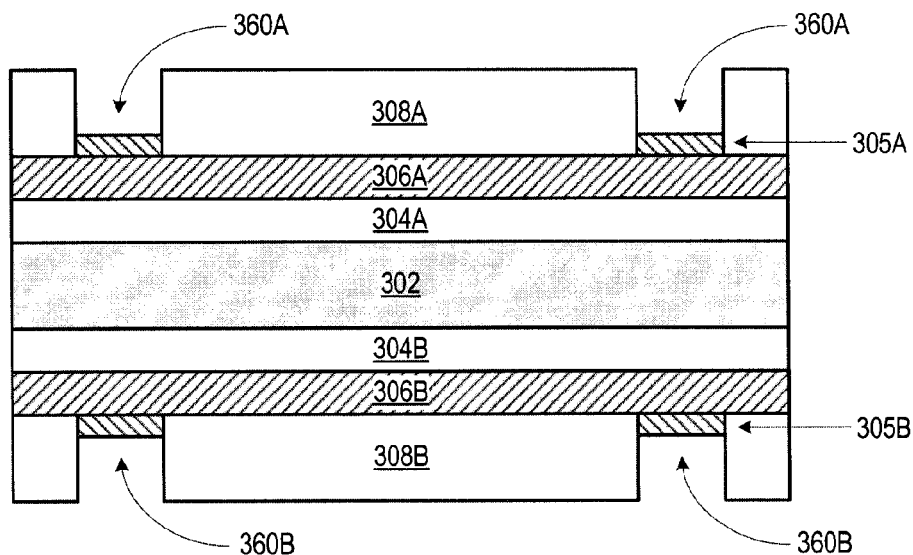
FIG. 4
FIG. 5

US 9,299,602 B2

ENABLING PACKAGE-ON-PACKAGE (POP) PAD SURFACE FINISHES ON BUMPLESS BUILD-UP LAYER (BBUL) PACKAGE

CROSS-REFERENCE TO RELATED APPLICATION

This patent application is a U.S. National Phase Application under 35 U.S.C. §371 of International Application No. PCT/US2011/066320, filed Dec. 20, 2011, entitled ENABLING PACKAGE-ON-PACKAGE (POP) PAD SURFACE FINISHES ON BUMPLESS BUILD-UP LAYER (BBUL) PACKAGE.

FIELD OF THE INVENTION

This invention relates generally to an integrated circuit package. More specifically, this invention relates to a bumpless build-up layer (BBUL) integrated circuit package.

BACKGROUNDS AND RELATED ARTS

In a flip-chip package, interconnect signals from an integrated circuit die connects to a package substrate through solder bumps (e.g., C4 bumps). As integrated circuits become more complex, more and more interconnect signals are required, and consequently, the number of solder bumps in a package also rises. With manufacturing processes moving to smaller geometries, the density of solders bumps increases dramatically, which severely reduces the amount of space left in the package to route the ever increasing number of interconnect signals. As a result, placement of the solder bumps is becoming exponentially more difficult.

An alternative packaging technique to a flip-chip package is a bumpless build-up layer (BBUL) package. Unlike a flip-chip package, the BBUL package does not use solder bumps to interconnect signals from the die to the package substrate. Instead, the BBUL package has build-up layers that are formed directly on the die. Interconnect layers are embedded in the build-up layers as part of the build-up process. By eliminating the need for solder bumps, a BBUL package allows the routing density to increase to accommodate the increasing number of interconnect signals.

Another benefit of the BBUL package is that package-on-package (PoP) pads can be formed on the top side of the package as part of the build-up process. The PoP pads allow for other integrated circuit devices such as memory devices and other electrical components such as decoupling capacitors to be attached to the top side of the BBUL package. This enables the placement of these other components to be much closer to the die to improve the performance of the integrated circuit. One type of PoP pad surface finish is a nickel-gold (Ni—Au) surface finish formed by an electrolytic plating process. The Ni—Au surface finish is formed by electrolytic plating a layer of Au onto an etch layer of copper (Cu), and then electrolytic plating a layer of Ni onto the layer of Au. Because this surface finish is formed by an electrolytic plating process, a manufacturer is required to have electrolytic surface finish equipment in order to manufacture the BBUL package.

BRIEF DESCRIPTION OF THE DRAWINGS

FIGS. 3-21 illustrate cross section views of an integrated circuit package during the manufacturing steps of a bumpless build-up layer (BBUL) process flow according to an embodiment of the present invention.

DETAILED DESCRIPTION OF THE PREFERRED EMBODIMENTS

Figure 1A:
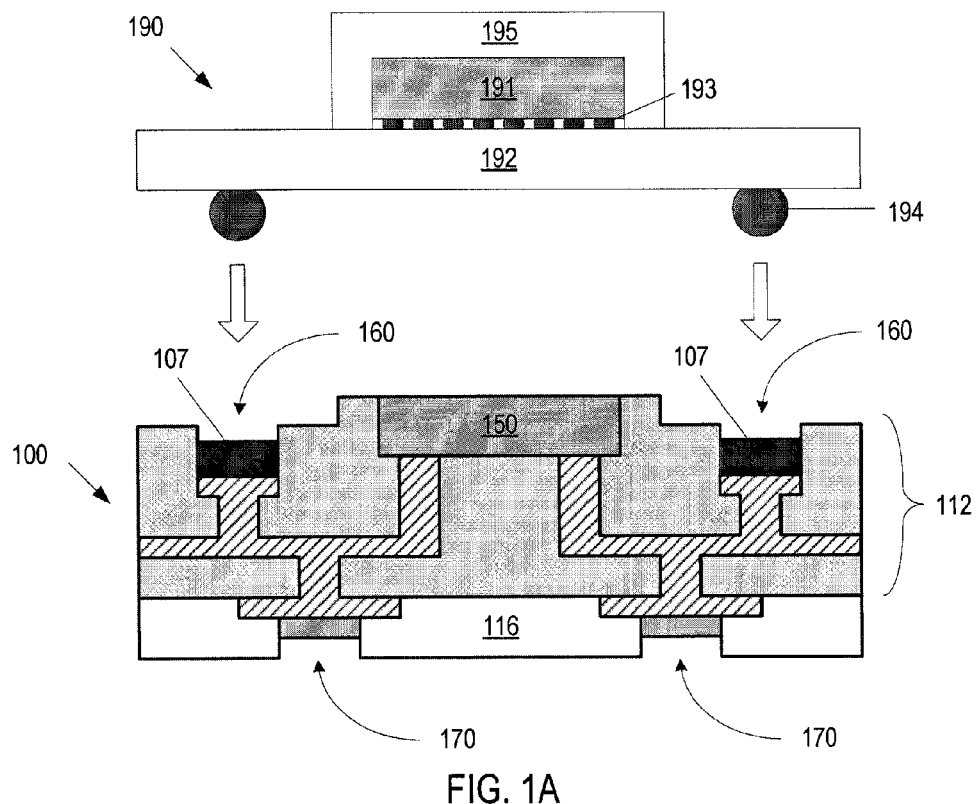
FIG. 1A illustrates a cross section view of an integrated circuit BBUL package according to an embodiment of the present invention.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive. Furthermore, the terms "above," "under," and "between" and "on" as used herein refer to a relative position of one component with respect to other components. As such, for example, one component above, under, or on another component may be directly in contact with the other component or may have one or more intervening components.

In one aspect, embodiments of the present invention disclose an improved bumpless build-up layer (BBUL) process flow that enables package-on-package (PoP) pad surface finish to be formed using an electroless plating process. By enabling PoP pad surface finish to be formed using an electroless plating process according to embodiments of the present invention, manufacturers may be spared from having to purchase new surface finish equipment in order to manufacture BBUL packages. For example, suppose a manufacturer has only electroless surface finish equipment. Instead of having to purchase new electrolytic surface finish equipment in order to build BBUL packages with PoP pads having an electrolytic surface finish, the manufacturer can reuse the same electroless surface finish equipment that the manufacturer already has to build BBUL packages. Furthermore, an electroless plated surface finish may be made thinner than an electrolytic plated surface finish to reduce material costs, and the amorphous properties of a surface finish resulting from an electroless plating process also yields a higher reliability PoP pad connection.

In another aspect, embodiments of the present invention disclose PoP pad surface finish options for a BBUL package that can be made of palladium (Pd), nickel-palladium (Ni—Pd), nickel-palladium-gold (Ni—Pd—Au), or palladium-nickel-palladium-gold (Pd—Ni—Pd—Au) formed by the improved BBUL process flow. Part of the improved BBUL process flow for forming these various surface finish options can be performed using either an electroless or an electrolytic plating process. This allows manufacturers to choose between the surface finish plating processes that would result in the best reuse of their existing equipment in order to adapt their existing equipment to build BBUL packages.

FIG. 1A illustrates a cross sectional view of an integrated circuit package according to embodiments of the present invention. The integrated circuit package 100 is a BBUL package that includes a die 150, one or more build-up layers 112 including a plurality of interconnect layers formed on an active surface of the die 150, a plurality of package-on-package (PoP) pads 160 formed on one side of the bumpless build-up layer 112, and a plurality of contact pads 170 formed on a second side of the bumpless build-up layer opposing the first side. The contact pads 170 are used to electrically couple and attach the integrated circuit package 100 to a socket or a motherboard. The die 150 may be a microprocessor die, a graphics die, a communications die, a memory die, or other integrated circuit component die. The PoP pads 160 have a pad surface finish 107 that allows another integrated circuit package and/or an external electrical component package to be soldered onto the PoP pads 160. This allows another integrated circuit package and/or an external electrical component package to be closely coupled to the integrated circuit package 100 near the die 150

The other integrated circuit package that may be electrically coupled to the PoP pads 160 of integrated circuit package 100 may be an integrated circuit package 190 that includes, for example, a die 191 that is mounted to a package substrate 192 through C4 solder bumps 193, an integrated heat spreader (IHS) 195 disposed above the die 191, and solder balls 194 for coupling the integrated circuit package 190 to the PoP pads 160 of integrated circuit package 100. The die 191 of the integrated circuit package 190 may be another microprocessor die, a graphics die, a communications die, or a memory die. An external electrical component package such as packaged decoupling capacitors, packaged clock sources such as a crystal oscillator, and/or other packaged electrical components with high speed signals that are susceptible to parasitics associated with long signal traces may also be coupled to the PoP pads 160. In other embodiments, other integrated circuit packages can be coupled to the PoP pads 160.

Figure 1B:
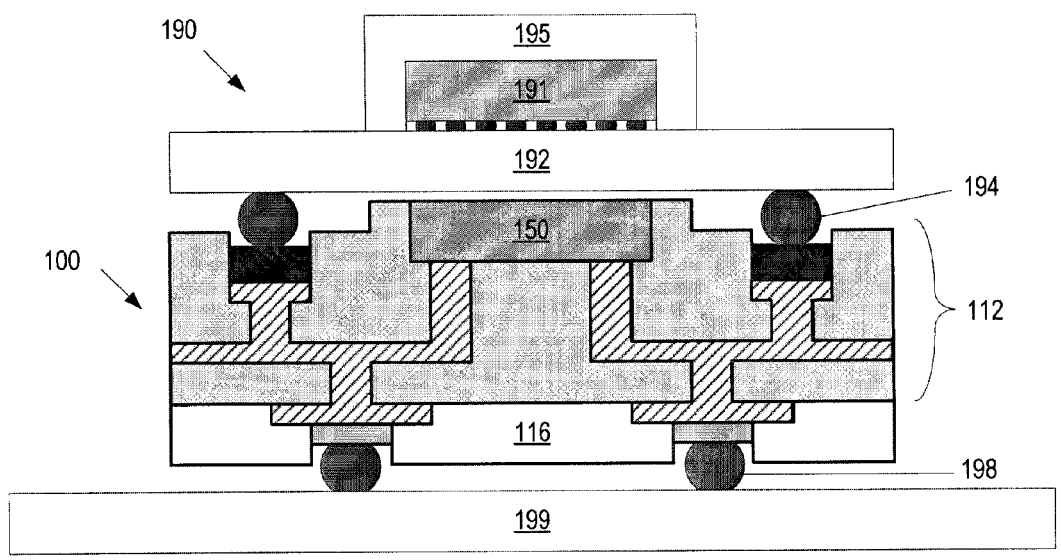
FIG. 1B illustrates a cross section view of a package-on-package assembly that includes an integrated circuit BBUL package assembled with another integrated circuit package according to an embodiment of the present invention.

FIG. 1B illustrates a cross sectional view of a package-on-package assembly that includes the integrated circuit package 100 assembled to another integrated circuit package 190. The integrated circuit package 100 is attached to a printed circuit board (PCB) 199, such as a motherboard, through solder balls 198 at the contact pads 170. The integrated circuit package 190 is coupled to the integrated circuit package 100 through solder balls 194 at the PoP pads 160. By placing the integrated circuit package 190 close to the die 150 of the integrated circuit package 100, the signal paths interconnecting the integrated circuit package 190 to the die 150 can be shortened to reduce signal degradation associated with long signal traces. Furthermore, the interconnect signals connecting integrated circuit package 190 to the die 150 can be routed within the integrated circuit package 100 in the build-up layers 112 without having to go through the PCB 199. This eliminates further signal degradation associated with routing signals through a PCB. Hence, the PoP pads 160 of the integrated circuit package 100 can improve the performance of a system by enabling other integrated circuit packages such as integrated circuit package 190 and/or external electrical component packages to be placed closer to the die 150.

The PoP pad surface finish options according to embodiments of the present invention include Pd, Ni—Pd, Ni—Au, Ni—Pd—Au, or Pd—Ni—Pd—Au. It should be noted that these surface finishes refer to layers of sub-surface finishes of different materials rather than different chemical compounds. Other integrated circuit packages such as integrated circuit package 190 and/or external electrical component packages are coupled to the PoP pads 160 through a solder material that may be made of tin, silver, and copper. During assembly, solder balls 194 attached to these other packages are melted onto the PoP pads 160 to form solder joints to electrically couple these components to the die 150. The properties and materials of the PoP pad surface finish 107 affect the solubility of the solder material. Hence, the reliability of the solder joints (i.e. the electrical contacts) between the integrated circuit package 100 and other integrated circuit packages such as integrated circuit package 190 and/or external electrical component packages that are coupled to the PoP pads 160 are dependent on the properties and materials of the PoP pad surface finish 107.

In some embodiments, the PoP pad surface finish 107 is formed by an electroless plating process. A PoP pad surface finish 107 that is formed by an electroless plating process has an amorphous or non-crystalline structure. An amorphous PoP pad surface finish 107 is more resistive to corrosion and provides a more solderable surface. In addition, an amorphous PoP pad surface finish 107 also allows additives to be added to the surface finish to further improve the reliability of the solder joint. For example, in an embodiment, a 5% by weight or less amount of phosphorus additive can be added to the amorphous PoP pad surface finish 107 to improve the solder joint reliability. By improving the solder joint reliability, the PoP pad surface finish 107 can also be formed thinner to reduce materials cost. In one embodiment, the amorphous PoP pad surface finish 107 may be about 60 nanometers (nm) or less.

In other embodiments, the PoP pad surface finish 107 can be formed using an electrolytic plating process. A conductive layer interconnecting the PoP pad locations is required to enable the electrolytic plating process. While an electrolytic plating process may result in a crystalline surface finish, embodiments with a PoP pad surface finish 107 that include Pd still provides for an improved PoP pad because Pd is less susceptible to oxidization and is more resistive to corrosion than other surface finish materials. In one embodiment, the thickness of the PoP pad surface finish 107 that is formed by an electrolytic process may be 300 nm or less.

Figure 2:
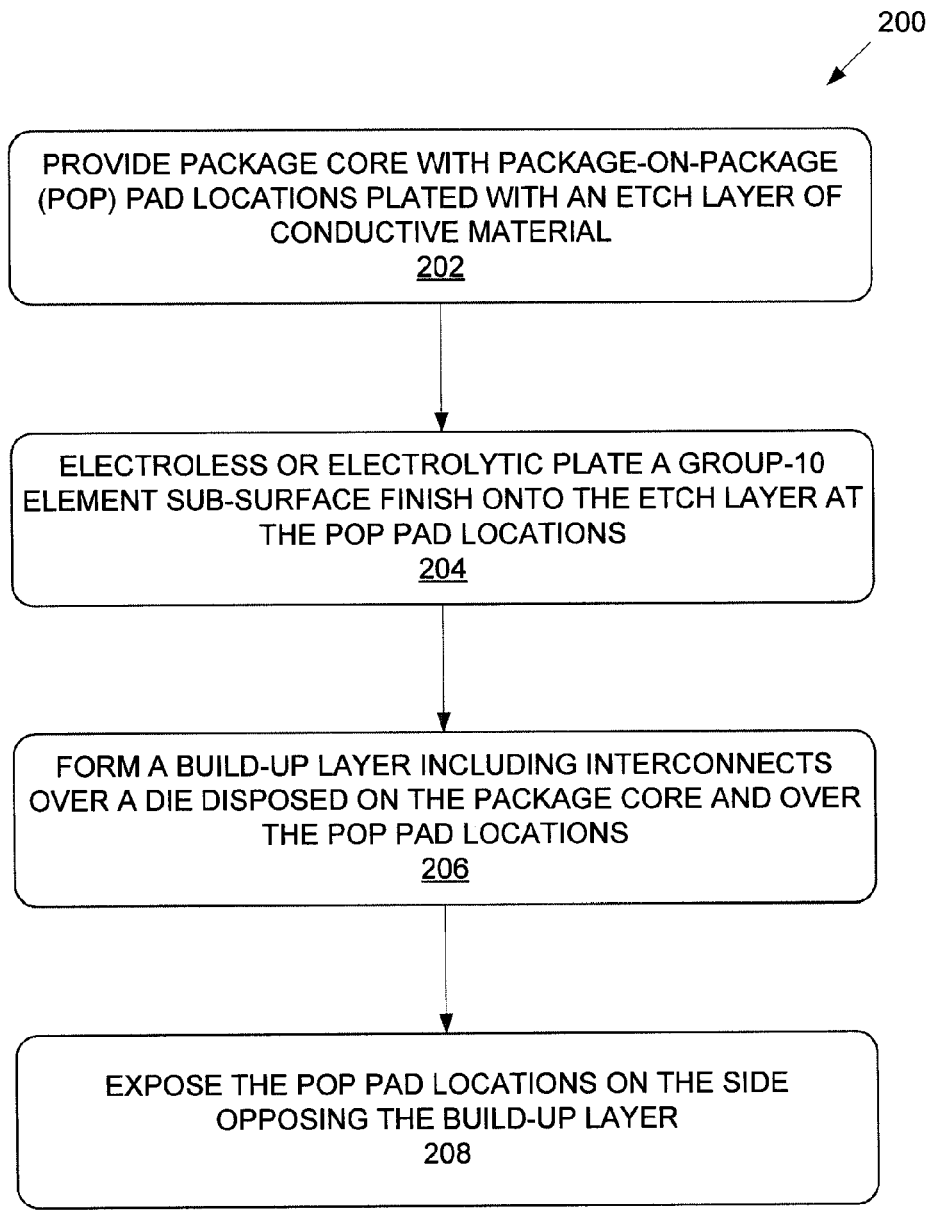
FIG. 2 illustrates a method for manufacturing an integrated circuit package using a bumpless build-up layer (BBUL) process flow according to an embodiment of the present invention.

FIG. 2 illustrates a flow diagram of a BBUL process flow 200 for forming a BBUL package according to embodiments of the present invention. At step 202, a package core is provided with a plurality of package-on-package (PoP) pad locations formed on the package core. The plurality of PoP pad locations are electrolytic or electroless plated with an etch layer of conductive material, for example, copper (Cu). At step 204, a group-10 element sub-surface finish layer, such as palladium (Pd) or nickel (Ni), is electroless or electrolytic plated onto the etch layer of conductive material. In some embodiments, an additional sub-surface finish layer of another group-10 element may be electroless or electrolytic plated onto the first sub-surface finish layer. At step 206, at least one build-up layer including interconnects formed therein are formed over a die disposed on the package core and over the PoP pad locations. The die disposed on the package core is at least partially covered or encapsulated by the build-up layer. The build-up layer is also formed over the PoP pad locations to cover the PoP pad locations. The build-up layer may include interconnects formed therein to interconnect the die with the PoP pad locations. At step 208, the PoP pad locations are exposed on the side that opposes the build-up layer. In some embodiments, the exposed PoP pad locations after step 208 will have the final surface finish. In other embodiments, the final surface finish of the PoP pads is formed by additional steps of electroless plating and/or immersion plating additional sub-surface finish layers.

The BBUL process flow 200 will now be described in more details with references to FIGS. 3-21. FIGS. 3-21 illustrate the cross sectional views of a BBUL package being formed during the manufacturing steps at the various stages of the BBUL process flow 200 according to embodiments of the present invention. Table 1 summarizes the BBUL process flow 200 for the various PoP pad surface finishes according to embodiments of the present invention.

TABLE 1

BBUL process flow

| Surface Finish | Process Flow | | | |
|---|---|---|---|---|
| | Step 202 | Step 204[1] | Step 206/208 | Optional |
| Pd | provide package core with PoP pad locations | plate Pd | form build-up layer and expose PoP pad locations | n/a |
| Ni-Pd | | plate Pd plate Ni | | n/a |
| Ni-Au | | plate Ni | | immersion Au |
| Ni-Pd-Au | | plate Ni | | plate Pd immersion Au |
| Pd-Ni-Pd-Au | | plate Ni plate Pd | | plate Pd immersion Au |

[1]The plating process in step 204 can be performed using an electrolytic or electroless plating process The operations of providing a package core with a plurality of PoP pad locations plated with an etch layer of conductive material in step 202 is illustrated in FIGS. 3-5. In FIG. 3, a dummy package core 302 is provided. The dummy package core 302 is used as a carrier from which the various layers of the BBUL package are built on. It should be noted that two BBUL packages (one on each side of the dummy package core 302) can be formed on the same dummy package core 302 by utilizing both sides of the package core. As shown in FIG. 3 one BBUL package can be formed on the top side of the dummy package core 302, and another BBUL package can be formed on the bottom side of the dummy package core 302. The dummy package core 302 is removed at a later stage in the BBUL process flow 200. The BBUL package that is formed on the top side of the dummy package core 302 will have a die side (as opposed to the land side) adjacent to the top side of the dummy package core 302, and the other BBUL package that is formed on the bottom side of the dummy package core 302 will have a die side (as opposed to the land side) adjacent to the bottom side of the dummy package core 302. In an alternative embodiment, only one BBUL package may be formed on one side of the dummy package core 302.

FIG. 4 illustrates the BBUL structure after laminating an adhesive film 304A/B onto the dummy package core 302 and laminating a conductive foil 306A/B of the conductive material onto the adhesive film 304A/B according to some embodiments. The adhesive film 304A/B serves as an adhesive layer to allow the BBUL package to be built on the dummy package core 302. In one embodiment, the adhesive film 304A/B is a polyethylene terephthalate (PET) film. In other embodiments, other adhesive materials may be used as the adhesive layer. The conductive foil 306A/B may be made of Cu or other conductive materials. In embodiments that use an electrolytic plating process, the conductive foil 306A/B may be used as a connection point for an electrode in the electrolytic plating processes in the subsequent stages of the BBUL process flow 200.

FIG. 5 illustrates the BBUL structure after laminating a patterned film layer 308A/B to form the PoP pad locations 360A/B, and electroless or electrolytic plating an etch layer 305A/B of conductive material onto the PoP pad locations 360A/B. In one embodiment, the patterned film layer 308A/B is a dry film resist (DFR) layer. The patterned film layer is developed to define the PoP pad locations 360A/B. After the PoP pad locations 360A/B are defined, an etch later 305A/B is plated onto the conductive foil 306A/B. In one embodiment, the etch layer 305A/B is made of the same material as the conductive foil 306A/B, for example, Cu. In other embodiments, other etch-able conductive materials may be used for the etch layer 305A/B.

Figure 6:
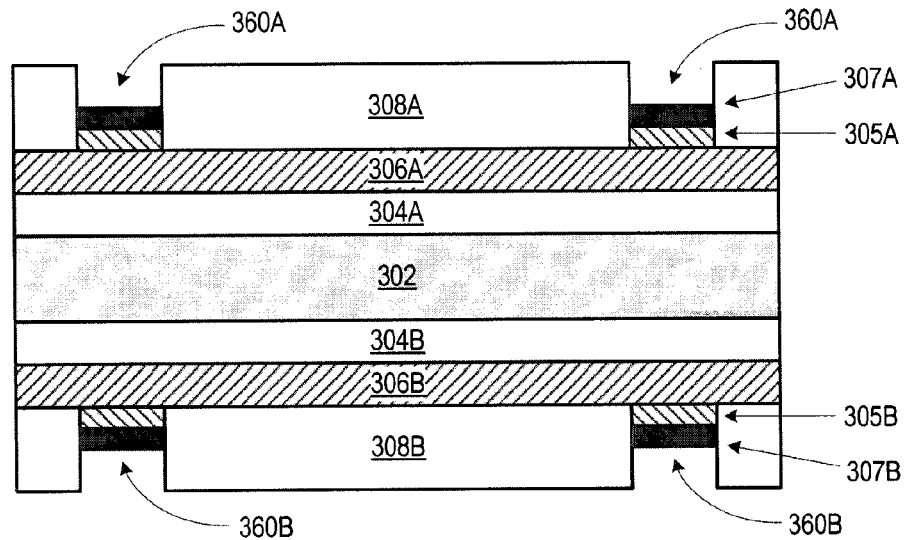

The operations of a electroless or electrolytic plating a group-10 element sub-surface finish layer 307A/B onto the etch layer 305A/B of conductive material in step 204 of the BBL process flow 200 according to embodiments of the present invention will now be described with reference to FIG. 6. At step 204, a group-10 element such as Pd or Ni is plated onto the etch layer 305A/B at the PoP pad locations to form a sub-surface finish layer 307A/B. The sub-surface finish layer 307A/B can be plated either with an electroless plating process or an electrolytic plating process. In one embodiment, the sub-surface finish layer 307A/B is Pd, and is the only surface finish layer to form a Pd PoP pad surface finish. In another embodiment, an additional layer of Ni is electroless or electrolytic plated onto the Pd sub-surface finish layer to form a Ni—Pd PoP pad surface finish. In these embodiments, the Pd that is plated onto the etch layer 305A/B serves as an etch stop or barrier layer for the etching process in a later step of the BBUL process flow 200. The Pd that is plated directly onto the etch layer 305A/B is also the material that will be exposed in the resulting BBUL package. Pd is less oxidative than other surface finish materials, and hence by having Pd as the exposed material, the resulting PoP pad surface finish will be less susceptible to corrosion.

In other embodiments, the sub-surface finish layer 307A/B that is electroless or electrolytic plated onto the etch layer 305A/B in step 204 is Ni. In these embodiments, additional sub-surface finish layers are formed in later steps of the BBUL process flow 200 to form Ni—Au or Ni—Pd—Au PoP pad surface finishes. In a different embodiment, a layer of Pd is electroless or electrolytic plated onto the Ni sub-surface finish 307A/B. In this different embodiment, additional sub-surface finish layers are formed in later steps of the BBUL process flow 200 to form a Pd—Ni—Pd—Au PoP pad surface finish.

Figure 7:
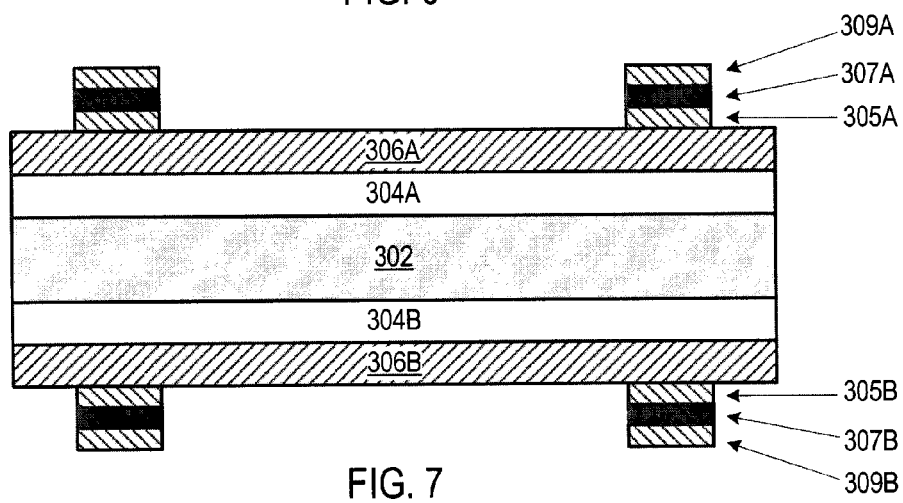
Figure 8:
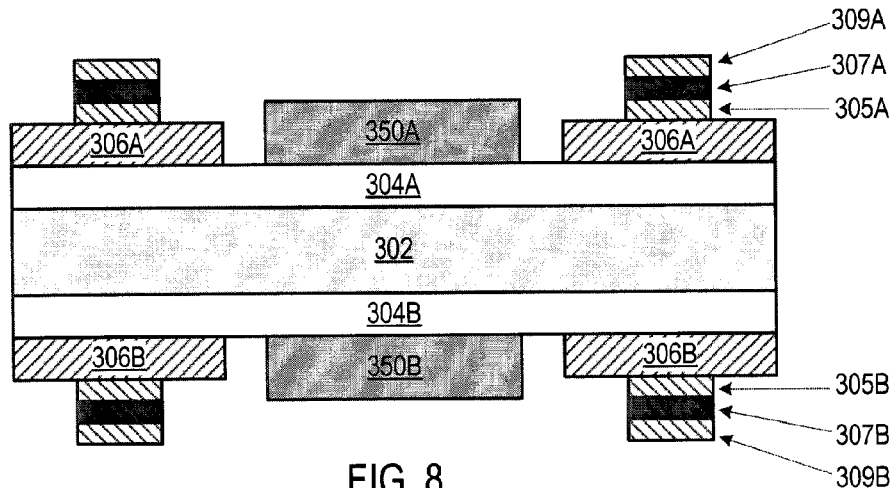

The operations in step 206 of forming at least one build-up layer including interconnects over a die disposed on the dummy package core 302 and the PoP pad locations 360A/B according to embodiments of the present invention will now be described with reference to FIGS. 7-16. Another conductive layer 309A/B is electroless or electrolytic plated onto the PoP pad locations 360A/B. In one embodiment, the conductive layer 309A/B may be made of Cu or a Cu alloy. In other embodiments, other conductive materials may be used. The patterned film layer 308A/B is then stripped resulting in the BBUL structure as shown in FIG. 7. The conductive layer 306A/B is etched to down to the adhesive layer 304A/B at locations where a die is to be mounted to the adhesive layer 304A/B. A die 350A/B is then mounted onto the adhesive layer 304A/B as shown in FIG. 8.

Figure 9:
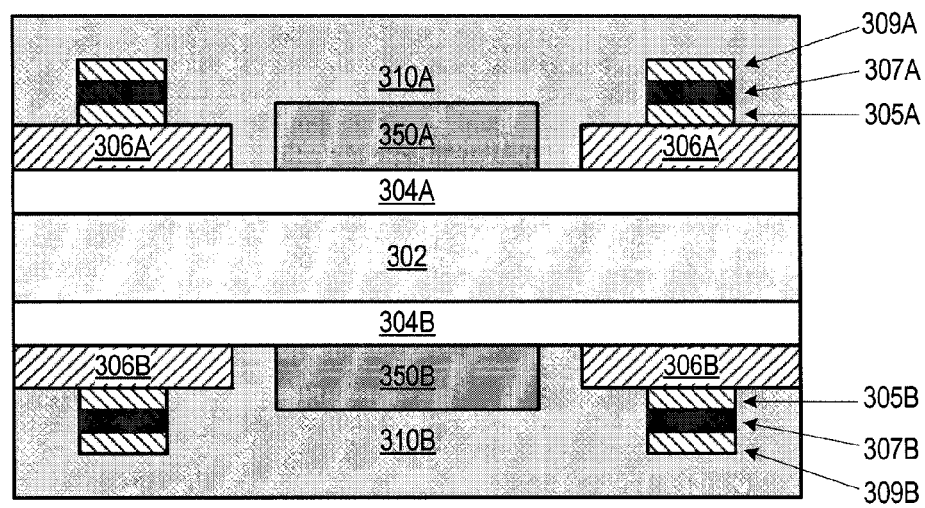
Figure 10:
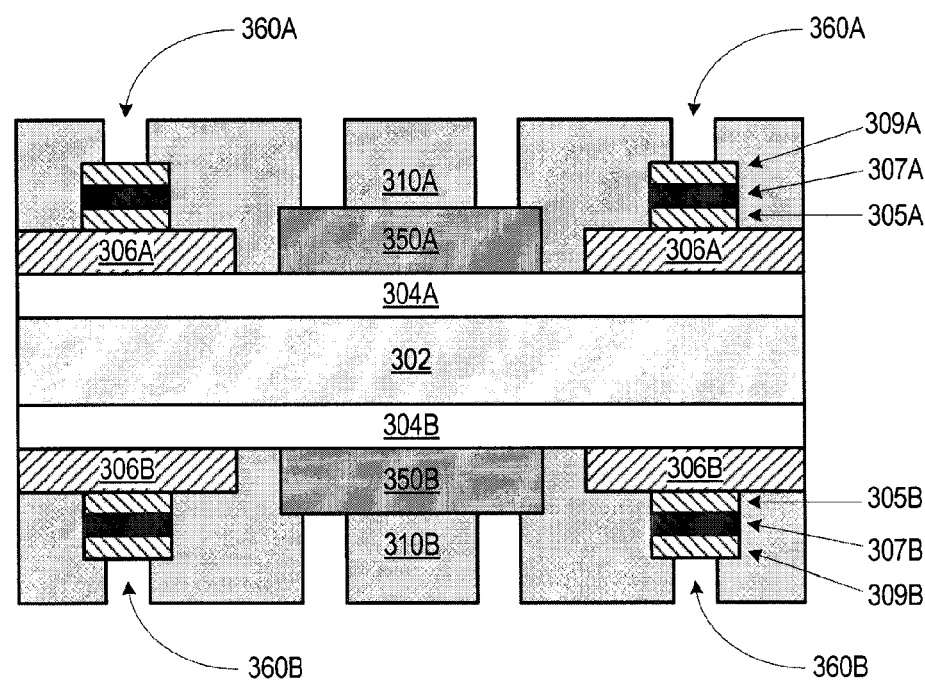
Figure 11:
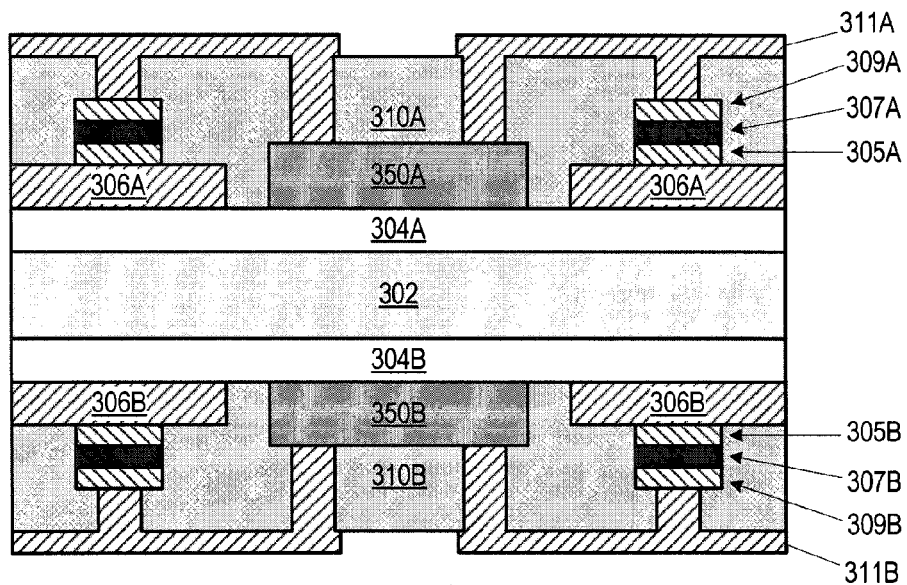

Next, an interconnect layer as part of the build-up layer is formed to encapsulate at least a portion of the die 350A/B. A build-up film 310A/B is laminated over at least a portion of the die 350A/B and the PoP pad locations 360A/B. In other embodiments, the build-up film 310A/B may encapsulate the entire die 350A/B as shown in FIG. 9. In an exemplary embodiment, the build-up film 310A/B is an Ajinomoto Build-up Film (ABF). In other embodiments, other build-up layer materials may be used. In FIG. 10, laser etching is performed to form via locations in the build-up film 310A/B. The via locations etched from the build-up film 310A/B include contact points at the PoP pad locations 360A/B and at contact pad locations on the die 350A/B. In FIG. 11, a conductive interconnect layer 311A/B is electroless or electrolytic plated over the via locations to interconnect the via locations. The conductive interconnect layer 311A/B may be made of Cu, or other conductive materials. The conductive interconnect layer 311A/B electrically connect the PoP pad locations 360A/B to signals from the die 350A/B.

Figure 12:
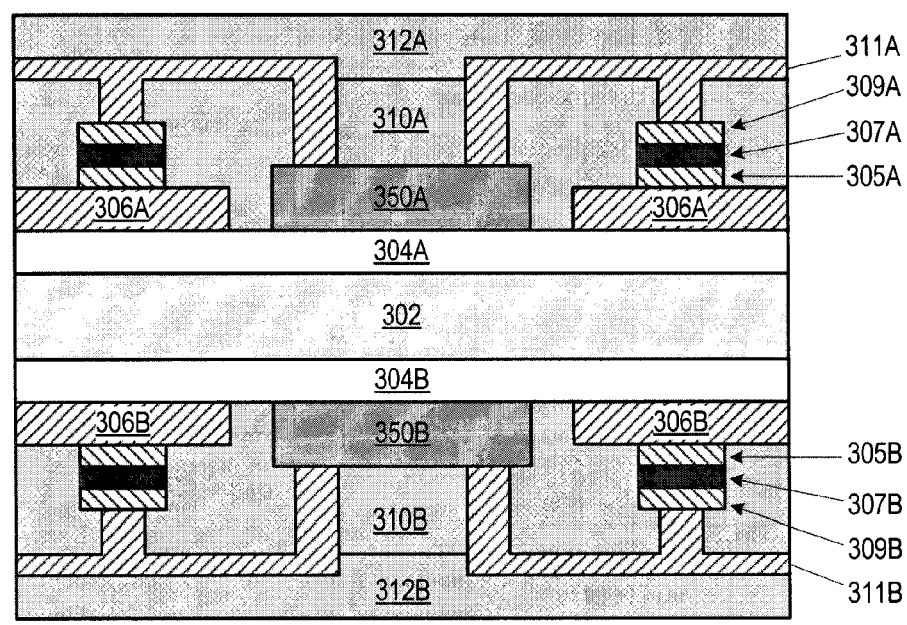
Figure 13:
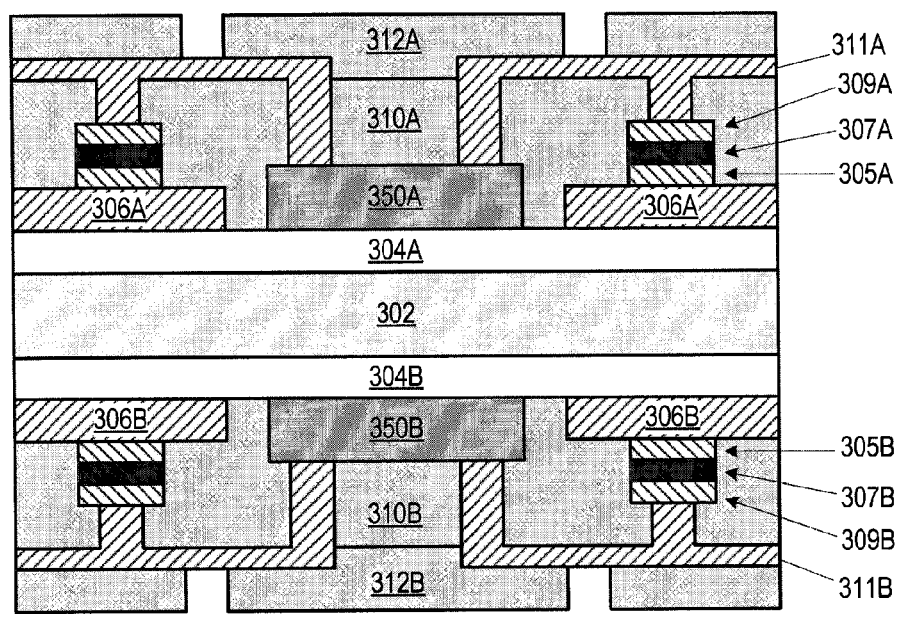
Figure 14:
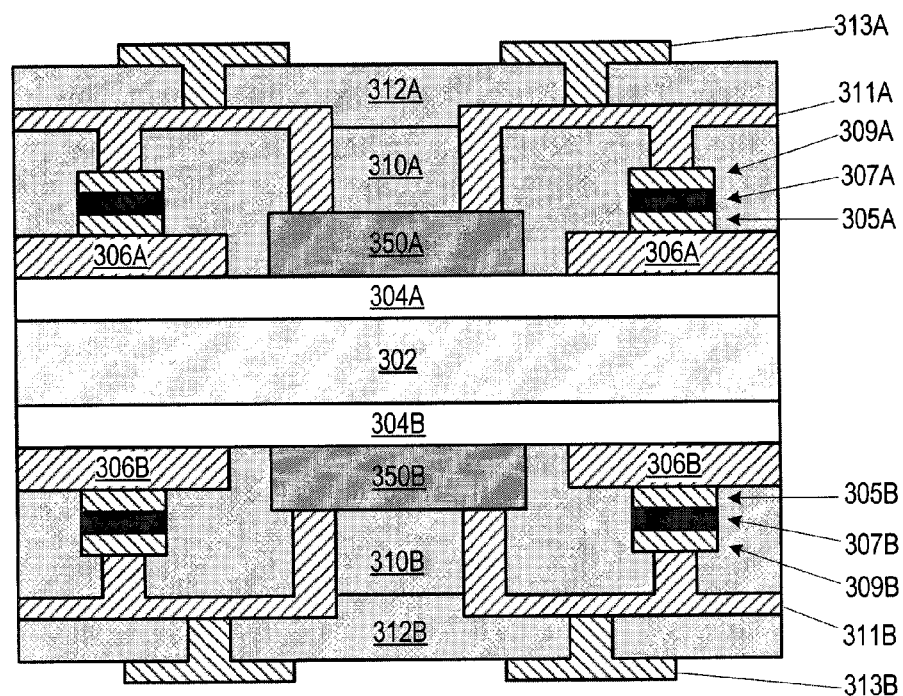

In some embodiments, additional interconnect layers may be formed in the additional build-up layers as shown in FIGS. 12-14. In FIG. 12, another build-up film 312A/B, for example, an ABF, is laminated over the conductive interconnect layer 311A/B. Additional via locations are laser etched into the build-up film 312A/B as illustrated in FIG. 13. An additional conductive interconnect layer 313A/B of conductive material is electroless or electrolytic plated onto the via locations as show in FIG. 14. In further embodiments, any number of additional build-up layers with interconnects form therein can be formed by repeating the steps of laminating an additional build-up film, laser etching additional via locations through the additional build-up film, and electroless or electrolytic plating an additional conductive interconnect layer connecting the additional via locations.

Figure 15:
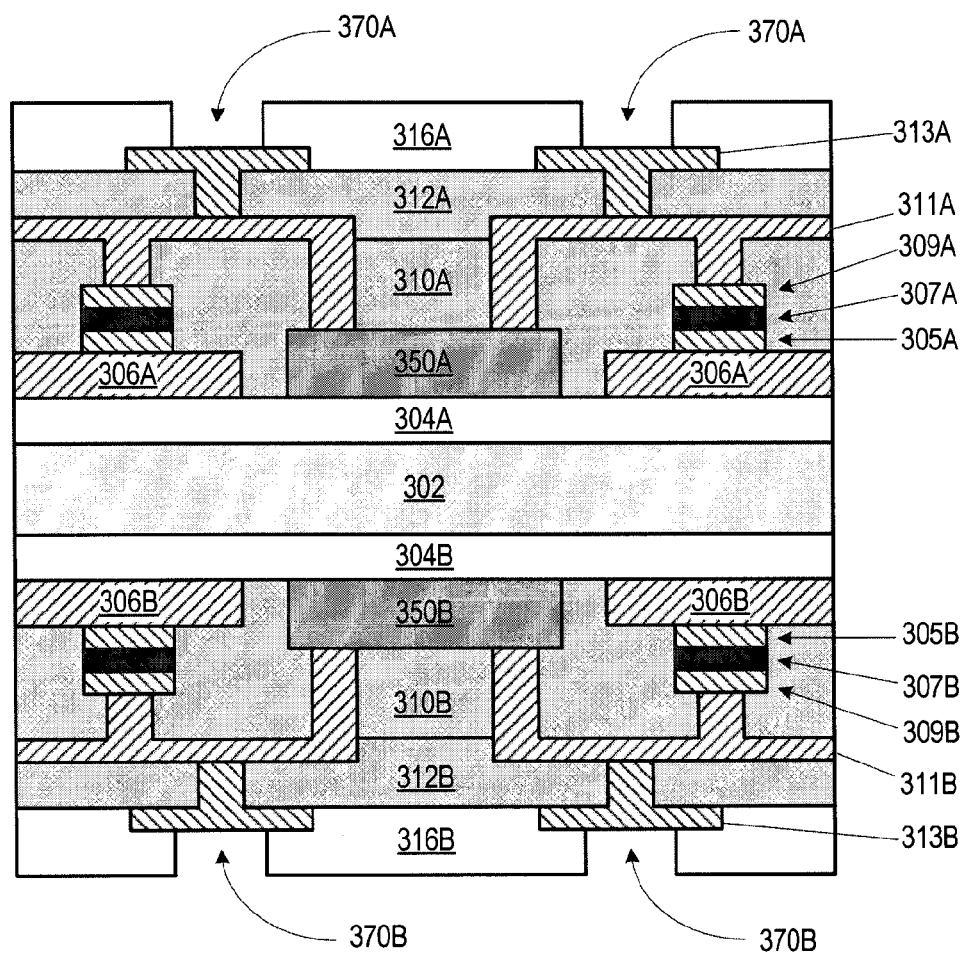
Figure 16:
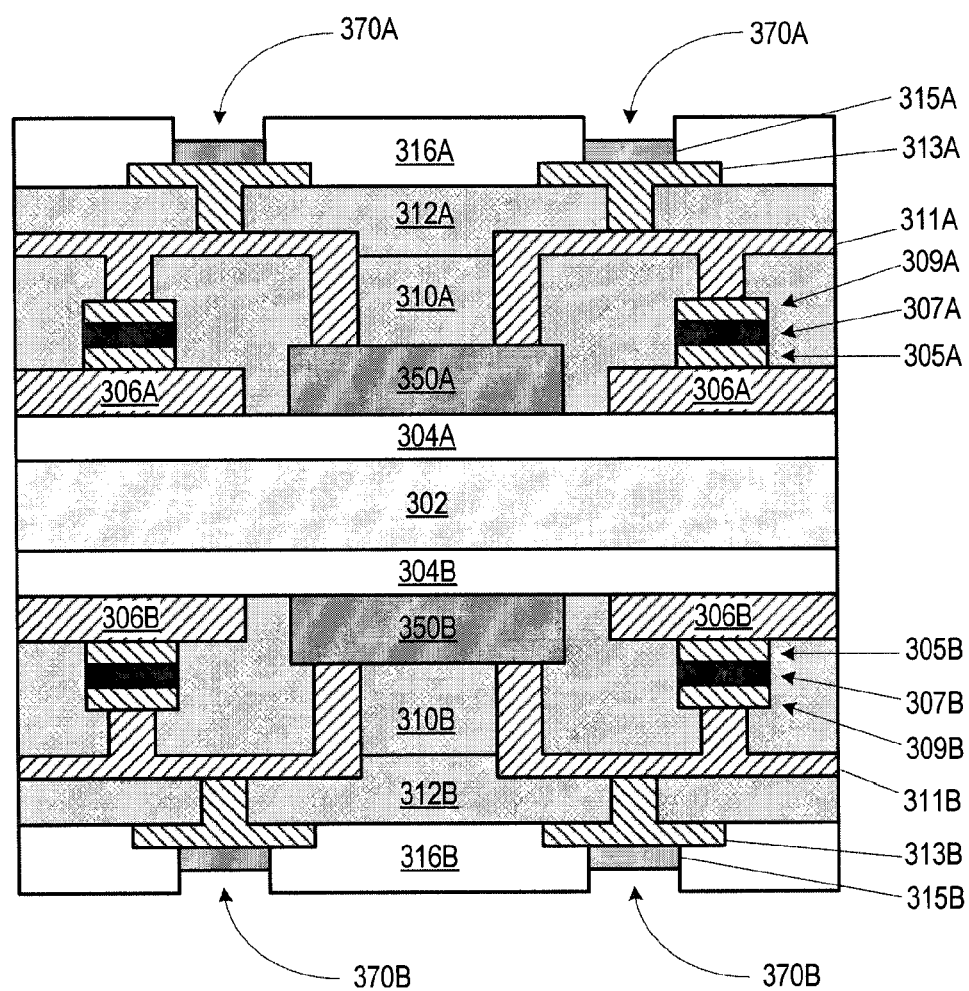

Having formed the interconnect layers in the build-up layer of the BBUL package, a solder resist (SR) coating 316A/B is coated over the last conductive interconnect layer 313A/B. The SR coating 316A/B is patterned to form contact pad locations on the land side of the BBUL package as shown in FIG. 15. In some embodiments, theses contact pad locations are the contact points for electrically connecting the BBUL package to a socket or to a motherboard. In FIG. 16, a preservative 315A/B is coated over the contact pad locations. In one embodiment, the preservative 315A/B is an organic solderability preservative (OSP). In other embodiments, other preservative may be used to preserve the solder adhesion properties of the contact pad locations.

Figure 17:
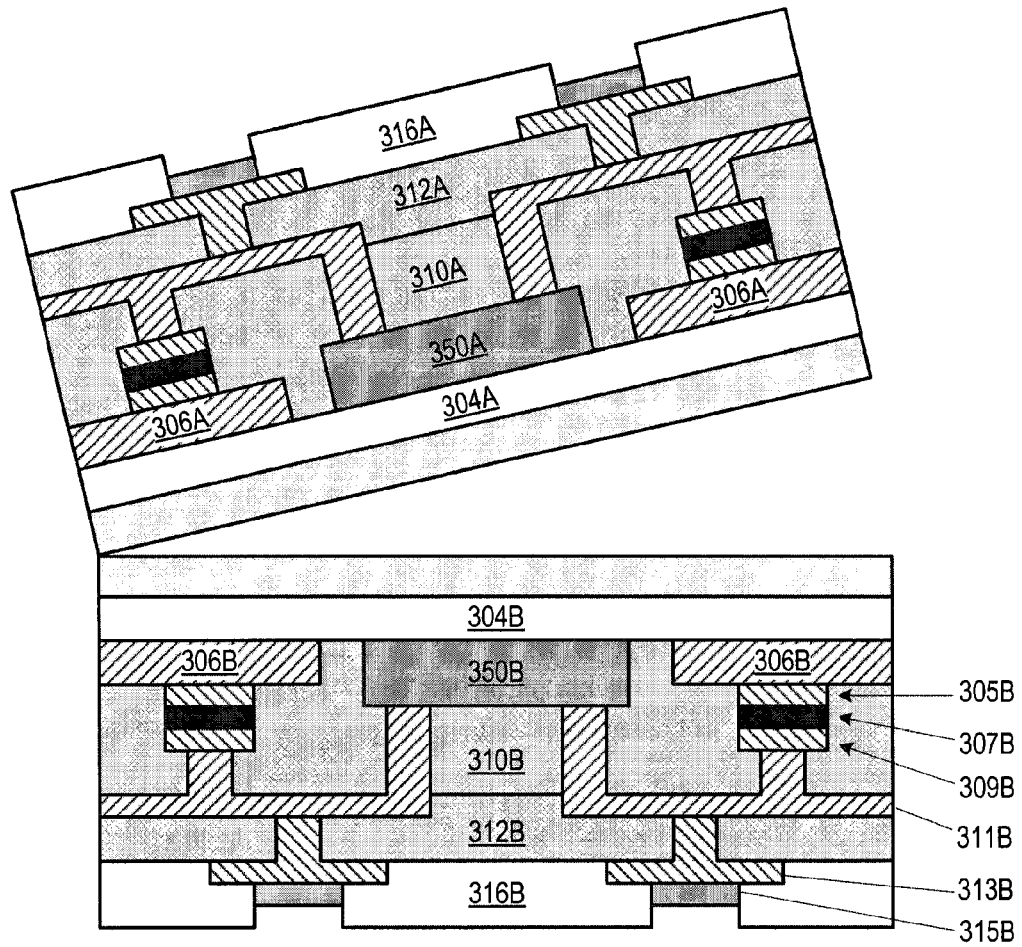
Figure 18:
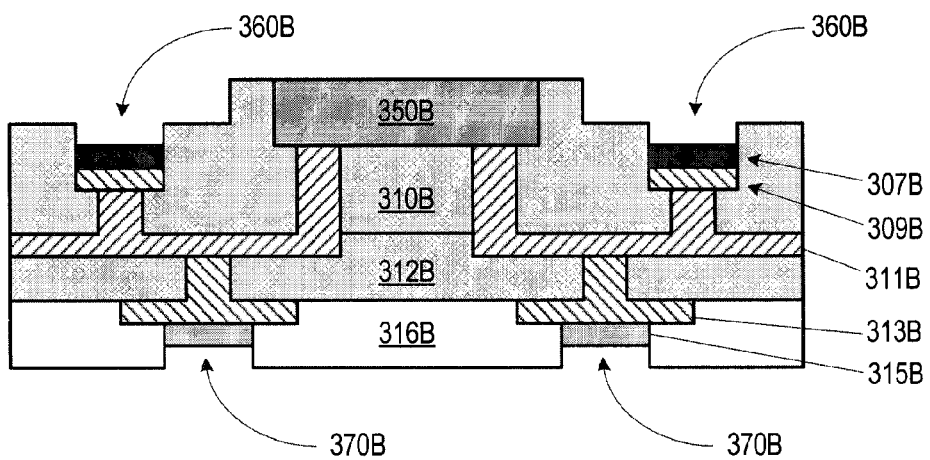

The operations of exposing the PoP pad locations 360A/B in step 208 of the BBUL process flow 200 will now be describe with references to FIGS. 17 and 18. In FIG. 17, the dummy package core 302 is separated to separate the two BBUL packages that were formed on the dummy package core 302. In other embodiments, only one BBUL package may be formed on the dummy package core 302. The dummy package core 302 and adhesive film 304A/B are then removed. The etch layer 305A/B and any remaining portion of the conductive foil 306A/B are etched away to expose the PoP pad locations 360A/B. The resulting BBUL package is shown in FIG. 18.

In the embodiments with the PoP pad surface finish options of Pd or Ni—Pd where Pd was electroless or electrolytic plated onto the conductive foil 306A/B, the PoP pad surface finish is complete, and other integrated circuit devices and/or external electrical components can be mounted to the BBUL package at the PoP pad locations 360A/B. In other embodiments where Ni was electroless or electrolytic plated onto the conductive foil 306A/B, the additional processing steps to form the final PoP pad surface finish options of Ni—Au, Ni—Pd—Au, or Pd—Ni—Pd—Au will now be described with references to FIGS. 19-21.

Figure 19:
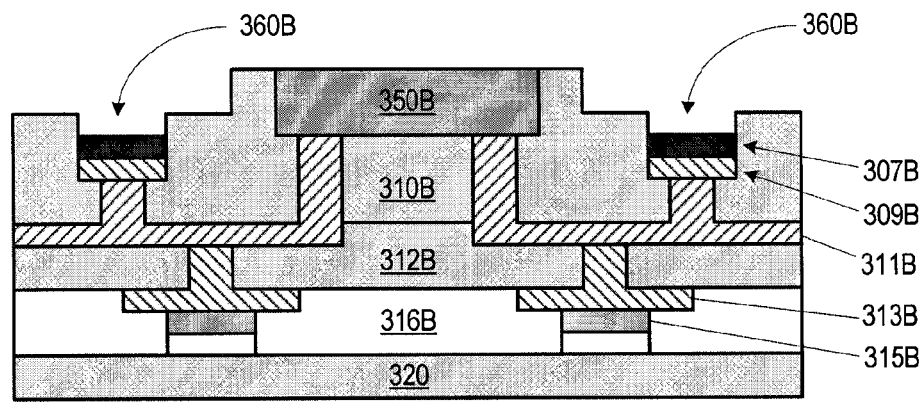
Figure 20:
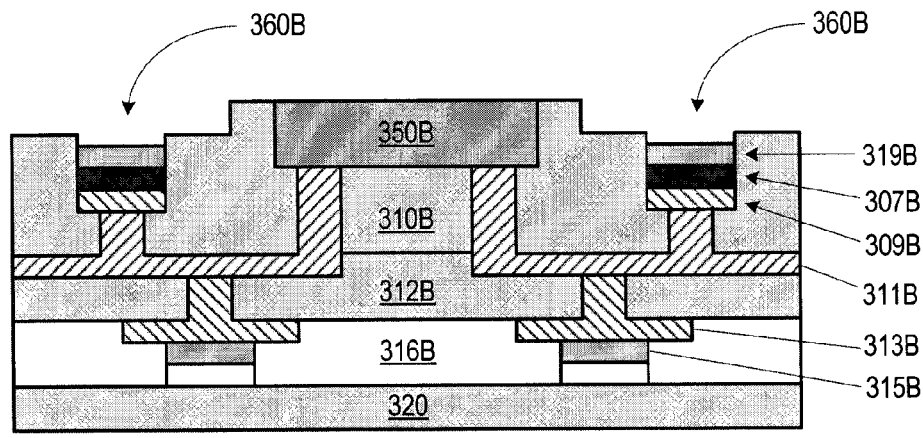
Figure 21:
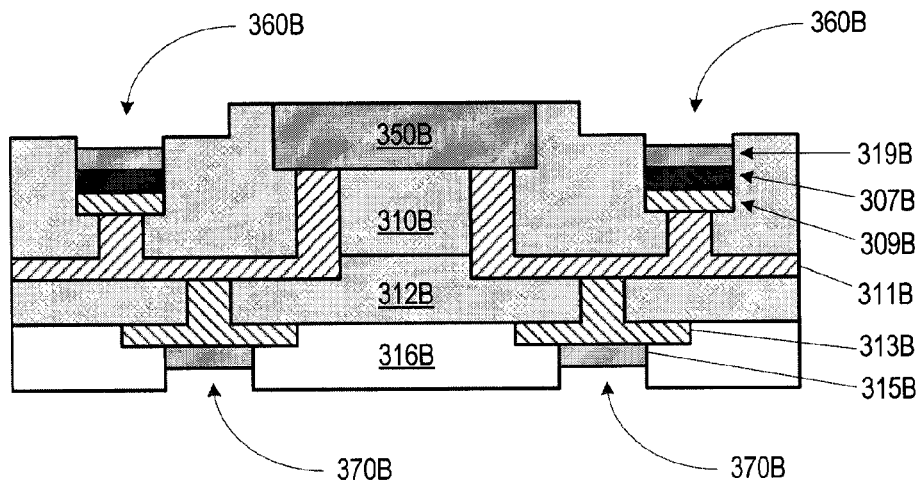

In FIG. 19, a protective film 320 is laminated onto the land side contact pad locations to protect the contact pads. In FIG. 20, the additional sub-surface finish layers 319B are formed on the PoP pad locations 360A/B. Recall that the conductive film 306A/B has been removed, and hence, in some embodiments, an electrolytic plating process cannot be used to form the additional sub-surface finish layers 319B. In the embodiments with the PoP pad surface finish options of Ni—Au, Ni—Pd—Au, or Pd—Ni—Pd—Au, an additional Ni layer may be plated onto the sub-surface finish layer 307B. In these embodiments, the Ni sub-surface finish layer 307B was exposed during the etching of the etch layer 305A/B. Because Ni is less effective as an etch stop or barrier layer than Pd, some of the Ni sub-surface finish layer 307B may have be etched away during the etching process. To repair the surface of the Ni sub-surface finish layer 307B, an additional Ni layer may be plated onto the Ni sub-surface finish layer 307B to provide a better surface for the subsequent steps of forming the pad surface finish. For the Ni—Au PoP pad surface finish embodiment, a layer of gold (Au) is immersion plated onto the Ni layer to form the Ni—Au PoP pad surface finish. For the Ni—Pd—Au and Pd—Ni—Pd—Au PoP pad surface finish embodiments, a Pd layer is electroless plated onto the Ni layer before the immersion plating of Au onto the Pad layer to form the Ni—Pd—Au or Pd—Ni—Pd—Au PoP pad surface finish. In FIG. 21, the protective film 320 is removed to form the resulting BBUL package.

Figure 22:
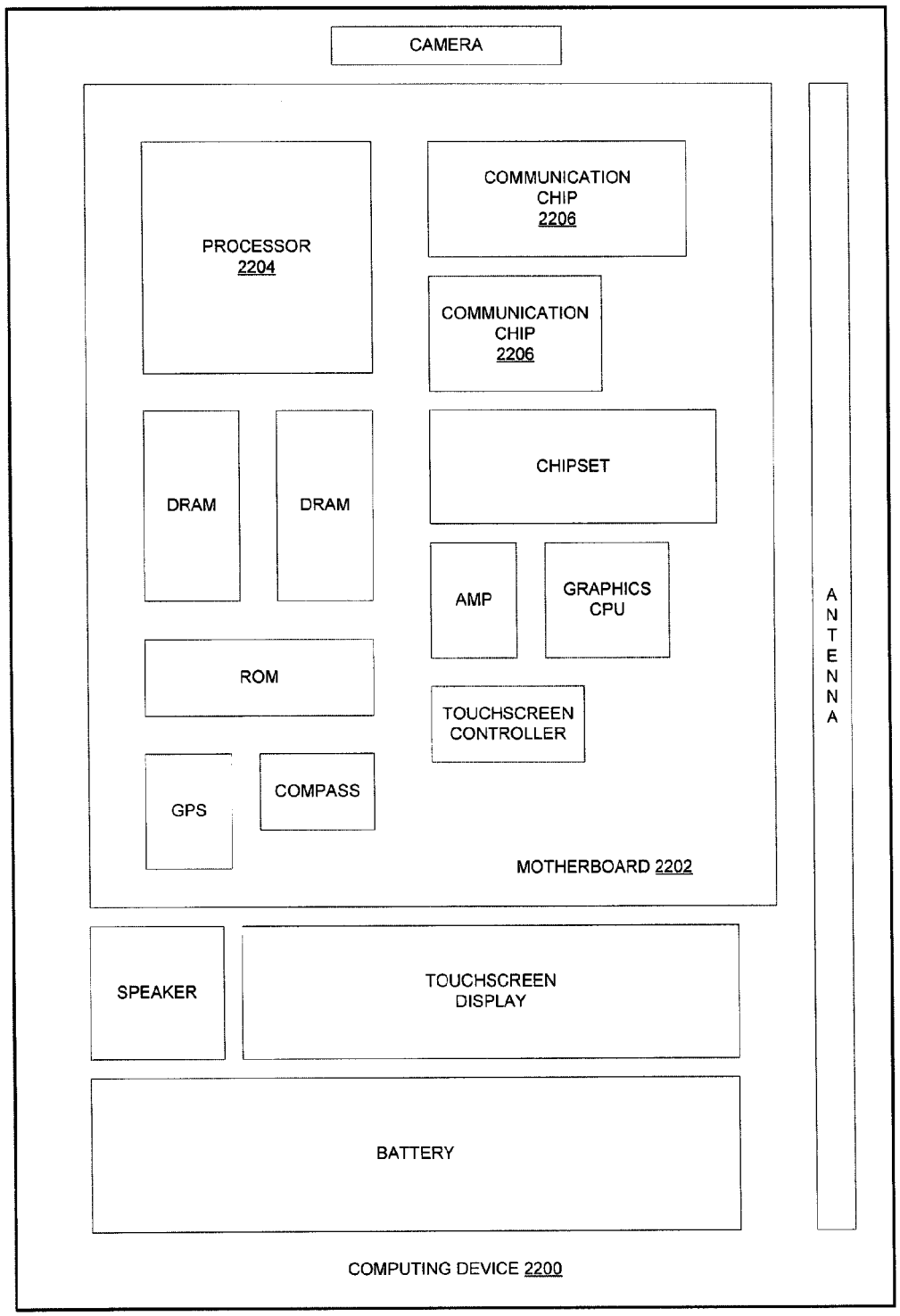
FIG. 22 illustrates a computing system according to one embodiment of the present invention.

FIG. 22 illustrates a computing device 2200 in accordance with one implementation of the invention. The computing device 2200 houses a board 2202. The board 2202 may include a number of components, including but not limited to a processor 2204 and at least one communication chip 2206. The processor 2204 is physically and electrically coupled to the board 2202. In some implementations the at least one communication chip 2206 is also physically and electrically coupled to the board 2202. In further implementations, the communication chip 2206 is part of the processor 2204.

Depending on its applications, computing device 2200 may include other components that may or may not be physically and electrically coupled to the board 2202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2206 enables wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2200 may include a plurality of communication chips 2206. For instance, a first communication chip 1206 may be dedicated to shorter range wireless communications such as Wi-Fi and Bluetooth and a second communication chip 2206 may be dedicated to longer range wireless communications such as GPS, EDGE, GPRS, CDMA, WiMAX, LTE, Ev-DO, and others.

The processor 2204 of the computing device 2200 includes an integrated circuit die packaged within the processor 2204. In some implementations of the invention, the integrated circuit die of the processor 2204 is packaged in a BBUL package with a PoP pad a surface finish formed by the BBUL process flow in accordance with implementations of the present invention. The term "processor" may refer to any device or portion of a device that processes electronic data from registers and/or memory to transform that electronic data into other electronic data that may be stored in registers and/or memory.

The communication chip 2206 also includes an integrated circuit die packaged within the communication chip 2206. In accordance with another implementation of the invention, the integrated circuit die of the communication chip 2206 is packaged in a BBUL package with a PoP pad a surface finish formed by the BBUL process flow in accordance with implementations of the present invention In further implementations, another component housed within the computing device 2200 may contain an integrated circuit die that is packaged in a BBUL package with a PoP pad a surface finish formed by the BBUL process flow in accordance with implementations of the present invention In various implementations, the computing device 2200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2200 may be any other electronic device that processes data.

The foregoing description of the preferred embodiments is provided to enable any person skilled in the art to make or use the present invention. Various modifications to these embodiments are possible, and the generic principles presented herein may be applied to other embodiments as well. As such, the present invention is not intended to be limited to the embodiments shown above but rather is to be accorded the widest scope consistent with the principles and novel features disclosed in any fashion herein.

The foregoing description of the preferred embodiments is provided to enable any person skilled in the art to make or use the present invention. Various modifications to these embodiments are possible, and the generic principles presented herein may be applied to other embodiments as well. As such, the present invention is not intended to be limited to the embodiments shown above but rather is to be accorded the widest scope consistent with the principles and novel features disclosed in any fashion herein.

What is claimed is:

1. A method of manufacturing an integrated circuit (IC) package, the method comprising:
   providing a package core with a plurality of package-on-package (PoP) pad locations formed on the package core, wherein the plurality of PoP pad locations are plated with an etch layer of conductive material;
   plating a sub-surface finish being a group-10 element onto the etch layer at the PoP pad locations;
   forming at least one build-up layer including interconnects formed therein over a die disposed on the package core and the PoP pad locations; and
   exposing the PoP pad locations on a side opposing the build-up layer.

2. The method of claim 1, wherein the sub-surface finish is Pd to form a Pd PoP pad surface finish.

3. The method of claim 1, wherein the sub-surface finish is Pd, and the method further comprises:
   plating Ni onto the sub-surface finish to form a Ni—Pd PoP pad surface finish.

4. The method of claim 1, wherein the sub-surface finish is Ni, and the method further comprises:
   subsequent to exposing the PoP pad locations:
      immersion plating gold (Au) onto the PoP pad locations to form a Ni—Au PoP pad surface finish.

5. The method of claim 1, wherein the sub-surface finish is Ni, and the method further comprises:
   subsequent to exposing the PoP pad locations:
      electroless plating a Pd layer onto the PoP pad locations; and
      immersion plating gold (Au) onto the Pd layer to form a Ni—Pd—Au PoP pad surface finish.

6. The method of claim 1, wherein the sub-surface finish is Ni, and the method further comprises:
   plating a layer of Pd onto the sub-surface finish;
   subsequent to exposing the PoP pad locations:
      electroless plating an additional Pd layer onto the PoP pad locations; and
      immersion plating gold (Au) onto the additional Pd layer to form a Pd—Ni—Pd—Au PoP pad surface finish.

7. The method of claim 1, wherein the step of providing the package core with the plurality of package-on-package (PoP) pad locations comprises:
   providing a package core;
   laminating an adhesive film onto a surface of the package core;
   laminating a conductive foil of the conductive material onto the adhesive film;
   laminating a patterned film layer to form the PoP pad locations; and
   plating the etch layer onto the PoP pad locations.

8. The method of claim 1, wherein the step of forming at least one build-up layer including interconnects comprises:
   plating a conductive layer of the conductive material onto the PoP pad locations;
   stripping the patterned film layer;
   etching a portion of the conductive foil to expose an area of the adhesive film;
   mounting the die onto the adhesive film;
   forming one of the build-up layers over the die, comprising:
      laminating a build-up film;
      laser etching via locations;
      plating a conductive interconnect layer connecting the via locations;
      coating the conductive interconnect layer with a solder resist coating;
      patterning the solder resist to form contact pad locations; and
      coating the contact pad locations with a preservative.

9. The method of claim 8, wherein the step of forming at least one build-up layer including interconnects further comprises:
- forming additional build-up layers, wherein each additional build-up layer is formed by:
  - laminating an additional build-up film;
  - laser etching additional via locations through the additional build-up film;
  - plating an additional conductive interconnect layer connecting the additional via locations.

10. The method of claim 1, wherein the step of exposing the PoP pad locations comprises:
- separating the package core;
- removing the adhesive film; and
- etching away the etch layer and a remaining portion of the conductive foil.

11. The method of claim 1, wherein the conductive material is copper (Cu).

12. The method of claim 7, wherein the adhesive film is a polyethylene terephthalate (PET) film.

13. The method of claim 8, wherein the build-up film is an Ajinomoto build-up film (ABF).

14. The method of claim 8, wherein the preservative is an organic solderability preservative (OSP).

15. An integrated circuit package, comprising:
- a die;
- a bumpless build-up layer including a plurality of interconnect layers formed on an active side of the die; and
- a plurality of package-on-package (PoP) pads formed on a first side of the bumpless build-up layer, wherein the PoP pads have a surface finish selected from a group consisting of Pd and Pd—Ni—Pd—Au.

16. The integrated circuit package of claim 15, wherein the surface finish has a thickness being less than or equal to 300 nanometers (nm).

17. The integrated circuit package of claim 15, wherein the surface finish has a thickness being less than or equal to 60 nm.

18. The integrated circuit package of claim 15, further comprising a plurality of contact pad locations formed on a second side of the bumpless build-up layer opposing the first side.

19. The integrated circuit package of claim 15, wherein an integrated circuit component is coupled to the PoP pads through a solder material to electrically connect the integrated circuit component to the die.

20. An integrated circuit package, comprising:
- a die;
- a bumpless build-up layer including a plurality of interconnect layers formed on an active side of the die; and
- a plurality of package-on-package (PoP) pads having an amorphous pad surface finish formed on a first side of the bumpless build-up layer.

21. The integrated circuit package of claim 20, wherein the amorphous pad surface finish is selected from a group consisting of Pd, Ni—Pd, Ni—Au, Ni—Pd—Au, and Pd—Ni—Pd—Au.

22. The integrated circuit package of claim 20, wherein the amorphous pad surface finish comprises a phosphorus additive.

23. The integrated circuit package of claim 20, wherein the amorphous pad surface finish has a thickness being less than or equal to 60 nm.

24. The integrated circuit package of claim 20, further comprising a plurality of contact pads on a second side of the bumpless build-up layer opposing the first side.

25. The integrated circuit package of claim 20, further comprising an electrical component coupled to the PoP pads through a solder material to electrically connect the electrical component to the die.

* * * * *